(12) United States Patent
Chang

(10) Patent No.: US 8,093,632 B2
(45) Date of Patent: Jan. 10, 2012

(54) PHASE CHANGE MEMORY DEVICE ACCOUNTING FOR VOLUME CHANGE OF PHASE CHANGE MATERIAL AND METHOD FOR MANUFACTURING THE SAME

(75) Inventor: Heon Yong Chang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 248 days.

(21) Appl. No.: 12/211,142

(22) Filed: Sep. 16, 2008

(65) Prior Publication Data
US 2009/0225589 A1 Sep. 10, 2009

(30) Foreign Application Priority Data
Mar. 4, 2008 (KR) .................. 10-2008-0020235

(51) Int. Cl.
*H01L 29/768* (2006.01)
*H01L 27/148* (2006.01)
*H01L 29/02* (2006.01)

(52) U.S. Cl. ........ 257/246; 365/113; 365/114; 257/247; 257/248

(58) Field of Classification Search .................. 257/2, 3, 257/5, 616, 246–248, E29.234–E29.239; 365/113, 114
See application file for complete search history.

(56) References Cited

U.S. PATENT DOCUMENTS

| | | | | |
|---|---|---|---|---|
| 3,934,261 | A * | 1/1976 | Sequin | 257/241 |
| 5,534,712 | A * | 7/1996 | Ovshinsky et al. | 257/3 |
| 5,618,744 | A * | 4/1997 | Suzuki et al. | 438/599 |
| 6,504,841 | B1 * | 1/2003 | Larson et al. | 370/386 |
| 2007/0181932 | A1 * | 8/2007 | Happ et al. | 257/314 |

FOREIGN PATENT DOCUMENTS

| KR | 10-0790449 B1 | 12/2007 |
|---|---|---|
| KR | 10-0791008 B1 | 12/2007 |

* cited by examiner

*Primary Examiner* — Kevin M Picardat
*Assistant Examiner* — Neil Prasad
(74) *Attorney, Agent, or Firm* — Ladas & Parry LLP

(57) ABSTRACT

A phase change memory device includes a silicon substrate including a plurality of active regions which extend in a first direction and are arranged at regular intervals in a second direction perpendicular to the first direction. Switching elements are formed in each active region of the silicon substrate and are spaced apart from one another. Phase change patterns are formed in the second direction and have the shape of lines in such that the phase change patterns connect side surfaces of pairs of switching elements which are placed adjacent to each other in a direction diagonal to the first direction.

5 Claims, 11 Drawing Sheets

PHASE CHANGE MEMORY DEVICE ACCOUNTING FOR VOLUME CHANGE OF PHASE CHANGE MATERIAL AND METHOD FOR MANUFACTURING THE SAME

CROSS-REFERENCE TO RELATED APPLICATIONS

The present application claims priority to Korean patent application number 10-2008-0020235 filed on Mar. 4, 2008, which is incorporated herein by reference in its entirety.

BACKGROUND OF THE INVENTION

The present invention relates to a phase change memory device and a method for manufacturing the same, and more particularly, to a phase change memory device which can prevent thermal crosstalk and a method for manufacturing the same.

In the semiconductor industry, a study has been directed toward developing a novel memory device having a simple configuration and being capable of accomplishing a high level of integration while retaining the characteristics of a non-volatile memory device. For example, a phase change memory device.

In the conventional phase change memory device, a phase change layer is interposed between a bottom electrode and an upper electrode. The phase change layer changes from a crystalline state to an amorphous state according to current flow between the bottom electrode and the upper electrode. The information stored in a cell is recognized according to the difference in resistance between the crystalline state and the amorphous state of the phase change layer.

As semiconductor devices become more highly integrated, the size of the phase change memory device gradually decreases as does the size of a thin film for heaters (hereinafter, referred to as "heaters"), which contact the phase change layer and serve as one of the electrodes directly influencing the change of the crystalline state of the phase change layer.

When the size of the heaters decreases as described above, the heaters cannot be formed to have a uniform size and are therefore formed non-uniformly. As such, the distribution of programming current necessary for the phase change of the phase change layer will also become non-uniform.

Further, as the size of cells is reduced, in the case of a phase change memory device, which utilizes micro holes, thermal crosstalk is likely to occur when programming the cells. Such thermal cross talk is an undesired phase change phenomenon caused by thermal influence from adjoining cells.

The thermal crosstalk can change the data of the cells or cause partial phase change in the cells, which results in the deterioration of the sensing margin of the phase change memory device. This occurs, for example, when the thermal crosstalk is of a temperature sufficient to change the phase change state of a neighboring cell.

SUMMARY OF THE INVENTION

Embodiments of the present invention include a phase change memory device which allows a phase change layer to be stably formed, and a method for manufacturing the same.

In one embodiment of the present invention, a phase change memory device comprises a silicon substrate including a plurality of active regions which extend in a first direction and are arranged at regular intervals in a second direction perpendicular to the first direction; a plurality of switching elements formed in each active region of the silicon substrate to be spaced apart from one another; and phase change patterns formed in the second direction to have the shape of lines in a manner such that the phase change patterns connect side surfaces of pairs of switching elements which are placed adjacent to each other in a direction diagonal to the first direction.

The switching elements comprise vertical PN diodes.

The phase change patterns are formed to connect side surfaces of pairs of switching elements which diagonally face each other in the second direction.

The phase change patterns are formed to connect side surfaces of pairs of switching elements which diagonally face each other in the first direction.

The phase change memory device further comprises upper electrodes formed on the phase change patterns to have the same shape as the phase change patterns.

In another embodiment of the present invention, a method for manufacturing a phase change memory device comprises the steps of forming a first interlayer dielectric on a silicon substrate including a plurality of active regions which extend in a first direction and are arranged at regular intervals in a second direction perpendicular to the first direction; defining contact holes by etching the first interlayer dielectric; forming switching elements in the contact holes; forming a second interlayer dielectric on the first interlayer dielectric including the switching elements; etching the second interlayer dielectric and thereby defining holes to expose side portions of the switching elements which face each other in a direction diagonal to the first direction and portions of the first interlayer dielectric between the portions of the switching elements; forming a phase change material and an upper electrode material on the second interlayer dielectric including the holes; and etching the upper electrode material and the phase change material and thereby forming line-shaped phase change patterns and upper electrodes to be connected with the switching elements arranged in the second direction and including surfaces of the holes.

Before the step of forming the first interlayer dielectric, the method further comprises the step of forming N-type impurity areas in surfaces of the respective active regions.

The switching elements are formed as vertical PN diodes.

In the pairs of switching elements which are located adjacent to each other in the direction diagonal to the first direction, the holes are defined to expose side portions of the switching elements which diagonally face each other in the first direction and portions of the first interlayer dielectric between the portions of the switching elements.

In the pairs of switching elements which are located adjacent to each other in the direction diagonal to the first direction, the holes are defined to expose side portions of the switching elements which diagonally face each other in the second direction and portions of the first interlayer dielectric between the portions of the switching elements.

The holes are defined to have a width of 50~300 nm in the direction diagonal to the first direction and a width of 10~100 nm in a direction perpendicular to the diagonal direction.

The phase change patterns are formed such that portions of the phase change patterns formed on the surfaces of the holes have a width of 10~100 nm.

The phase change material is formed on the surfaces of the holes.

The phase change material is formed to fill the holes.

DESCRIPTION OF SPECIFIC EMBODIMENTS

In the present invention, line-shaped phase change patterns are formed along a direction perpendicular to the active regions. Pairs of diagonally adjacent switching elements (with respect to the direction in which active regions extend) in a semiconductor substrate are connected by the phase change patterns. Accordingly, since the phase change patterns are formed while creating interfaces contacting vertical PN diodes, phase change occurs in the interfaces between the phase change patterns and the vertical PN diodes.

Accordingly, in the present invention, a reset fail due to volume change of the phase change material can be reduced when phase change occurs. Also, in the present invention, because the phase change patterns are formed in the shape of lines including the sides of the vertical PN diodes, processes can be stably conducted, and thermal crosstalk can be prevented.

Hereafter, the specific embodiments of the present invention will be described in detail with reference to the accompanying drawings.

Figure 1:
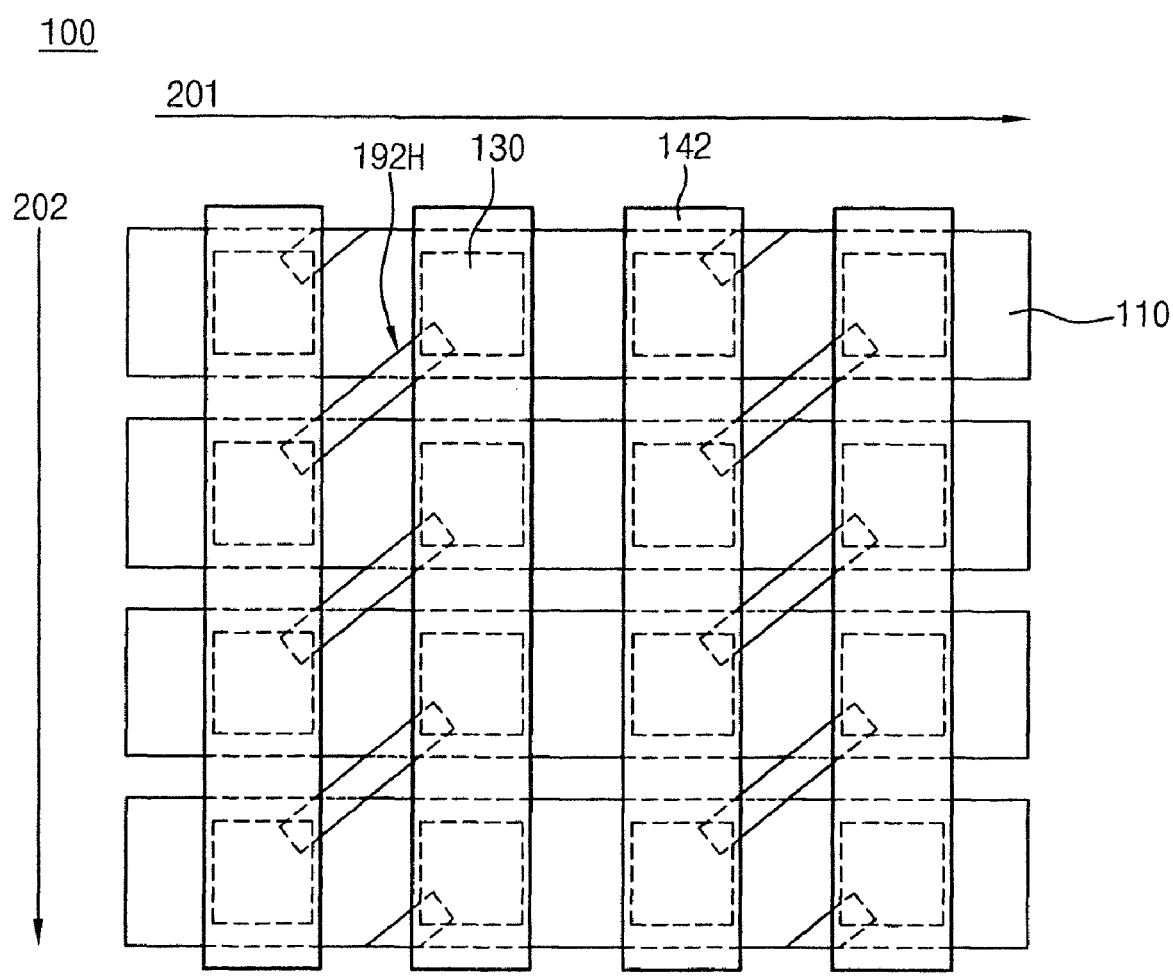
FIG. 1 is a plan view showing a phase change memory device in accordance with an embodiment of the present invention.

FIG. 1 is a plan view showing a phase change memory device in accordance with an embodiment of the present invention. Referring to FIG. 1, active regions 110 are defined in a silicon substrate 100 and extend in a first direction 201. Vertical PN diodes 130 serving as switching elements are formed in the active regions 110 spaced apart from one another. In diagonally adjacent pairs of vertical PN diodes 130 (where the diagonal direction is with respect to the first direction 201), the stacked patterns of line-shaped phase change patterns 141 and upper electrodes 142 are formed along a second direction 202 perpendicular to the first direction 201 so as to connect the vertical PN diodes 130 which are diagonally opposite each other with respect to the first direction 201.

FIGS. 2A through 2F are plan views showing the processes of a method for manufacturing a phase change memory device in accordance with another embodiment of the present invention, and FIGS. 3A through 3F are cross-sectional views taken along the lines A-A' of FIGS. 2A through 2F. A method for manufacturing a phase change memory device in accordance with an embodiment of the present invention will be described below with reference to these drawings.

Figure 2A:
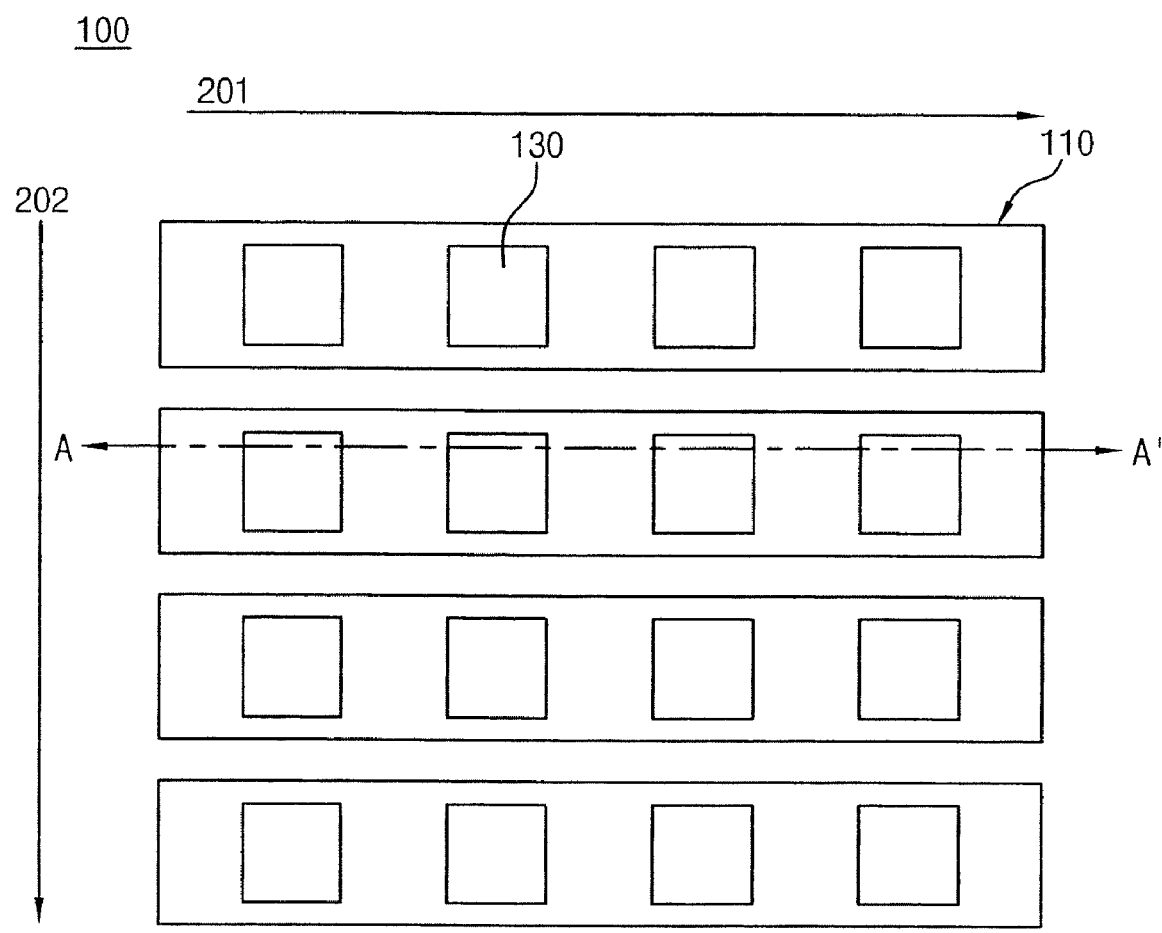
FIGS. 2A through 2F are plan views showing the processes of a method for manufacturing a phase change memory device in accordance with another embodiment of the present invention.
Figure 3A:
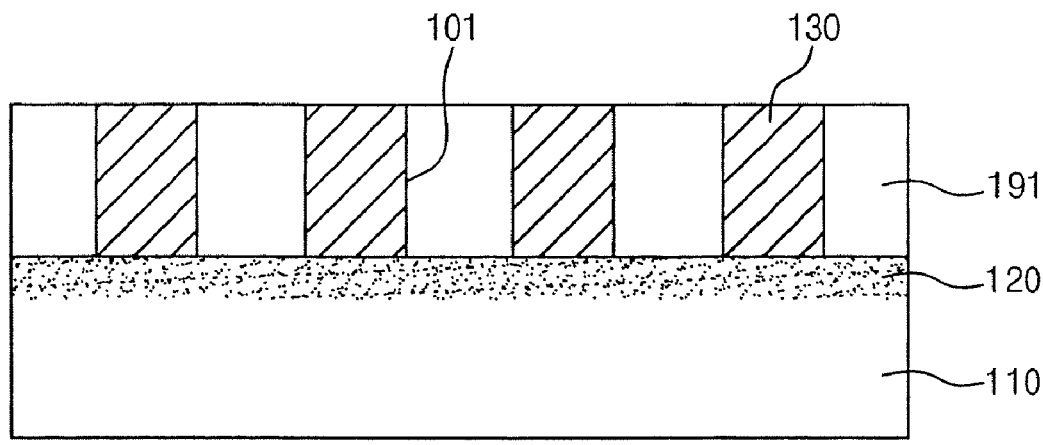
FIGS. 3A through 3F are cross-sectional views taken along the lines A-A' of FIGS. 2A through 2F showing the processes of a method for manufacturing a phase change memory device in accordance with an embodiment of the present invention.

Referring to FIGS. 2A and 3A, N-type impurity regions 120 are formed in the active regions 110 by implanting impurity ions into a silicon substrate 100, which includes a plurality of active regions 110 extending in a first direction 201 and located at regular intervals along a second direction 202 perpendicular to the first direction 201. A first interlayer dielectric 191 is formed on the silicon substrate 100, then first contact holes 101 are defined to delimit switching element forming areas by etching the first interlayer dielectric 191.

Vertical PN diodes 130 serving as switching elements are formed in the first contact holes 101. The vertical PN diodes 130 are formed such that a plurality of vertical PN diodes 130 are located in each active region 130 and are spaced apart from one another as shown in FIG. 2a. Preferably, the vertical PN diodes 130 are formed by forming an epi-silicon layer in the first contact holes 101, implanting N-type impurity ions into the epi-silicon layer to form N-type areas, and then implanting P-type impurity ions into the upper surface of the epi-silicon layer.

A silicide layer (not shown with detail) can be formed on the upper surfaces of the vertical PN diodes 130 by conducting a silicide process on the silicon substrate 100 having the vertical PN diodes 130.

Figure 2B:
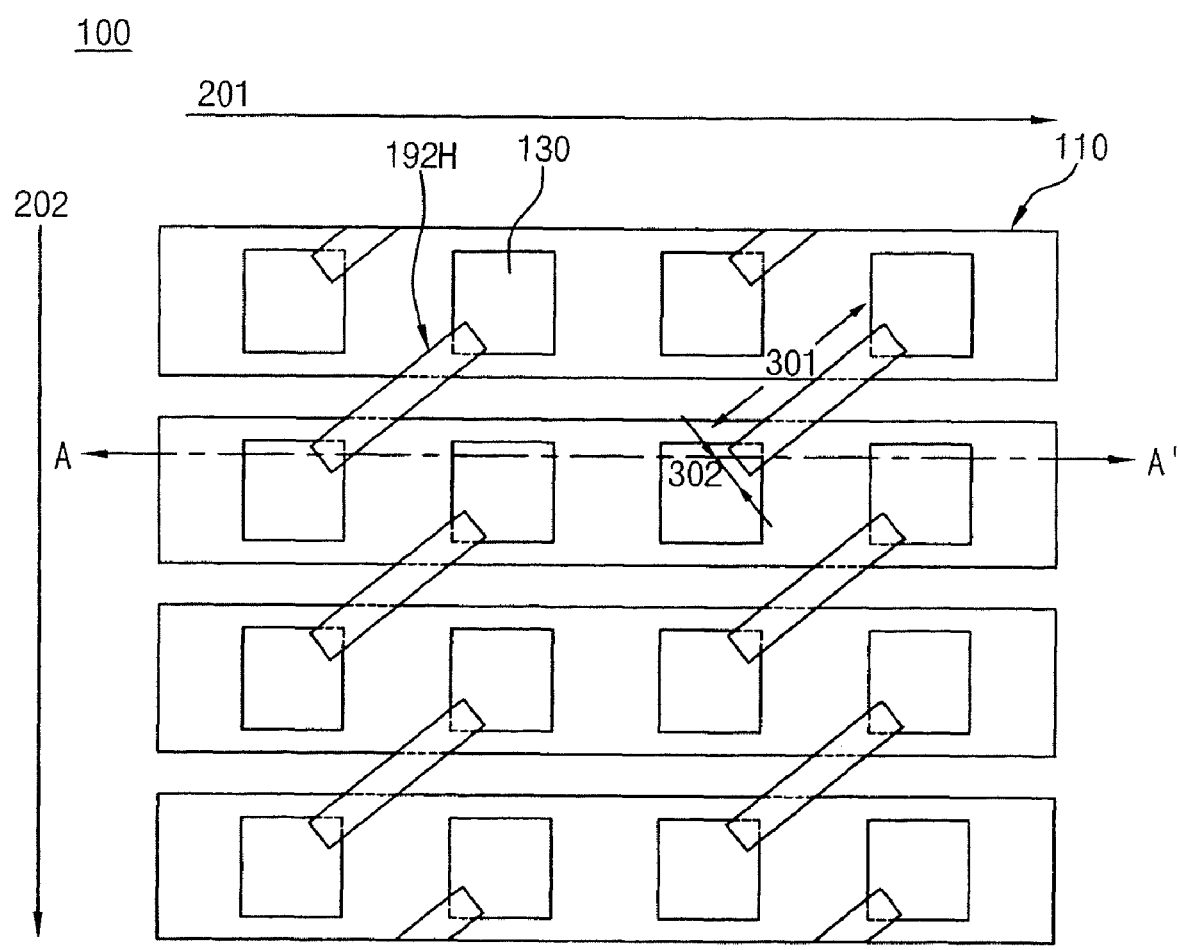
Figure 3B:
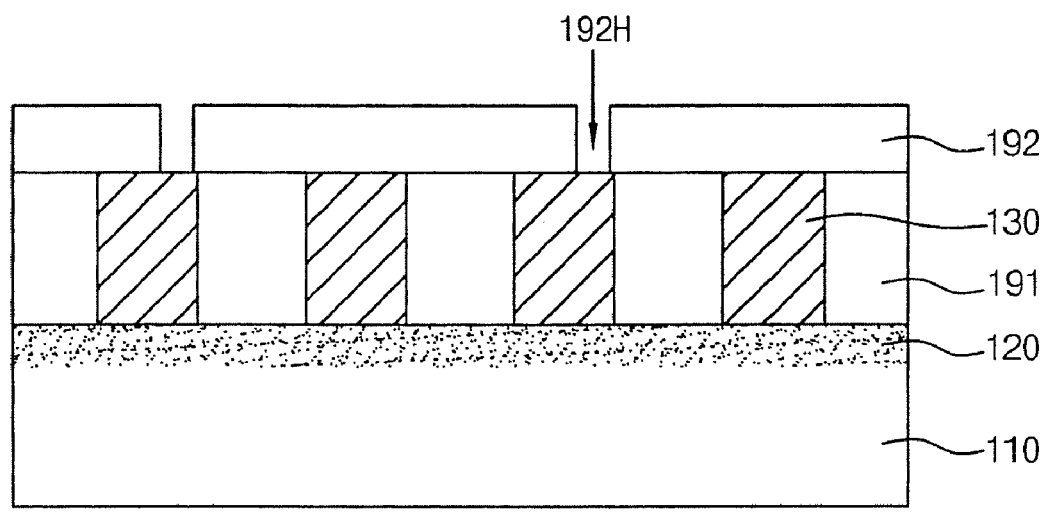

Referring to FIGS. 2B and 3B, a second interlayer dielectric 192 is formed on the first interlayer dielectric 191 and the vertical PN diodes 130, then holes 192H are defined by etching the second interlayer dielectric 192. The holes 192H are formed in pairs of vertical PN diodes 130 which are adjacent to each other in a direction 301 that is diagonal to the first direction 201. The holes 192H are arranged in the second direction 202 and expose portions of the diagonally adjacent vertical PN diodes 130 in the direction 301 and portions of the first interlayer dielectric 191 between the exposed portions of the vertical PN diodes 130

The holes 192H are defined to have a width of 50~300 nm in the direction 301 diagonal to the first direction 201 and a width of 10~100 nm in a direction 302 perpendicular to the diagonal direction 301 as shown in FIG. 2b.

Therefore, a photo process for defining the holes 192H can be stably conducted because the holes 192H are defined in the direction 301, which is diagonal with respect to the active regions 110. Phase change patterns 141 are subsequently formed in the holes 192H.

Figure 2C:
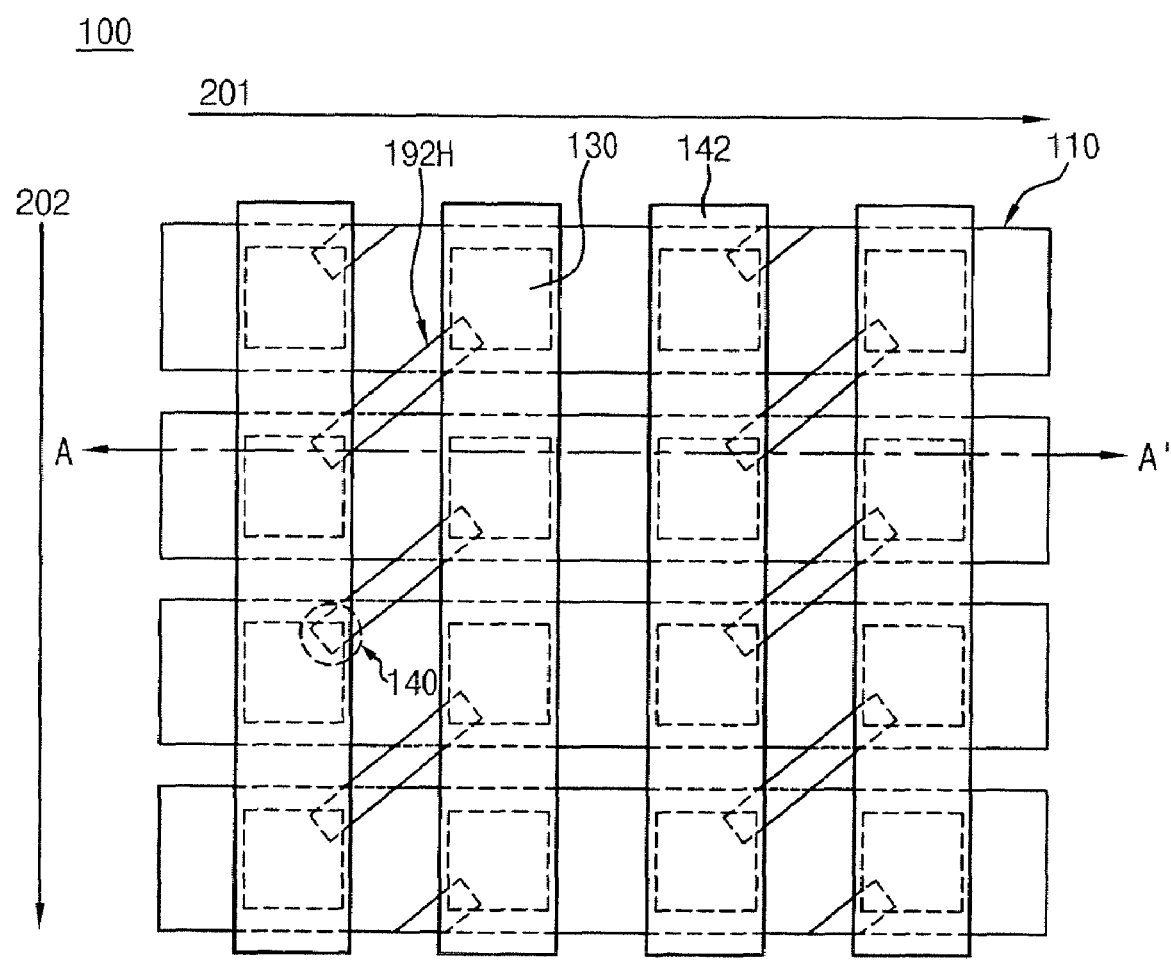
Figure 3C:
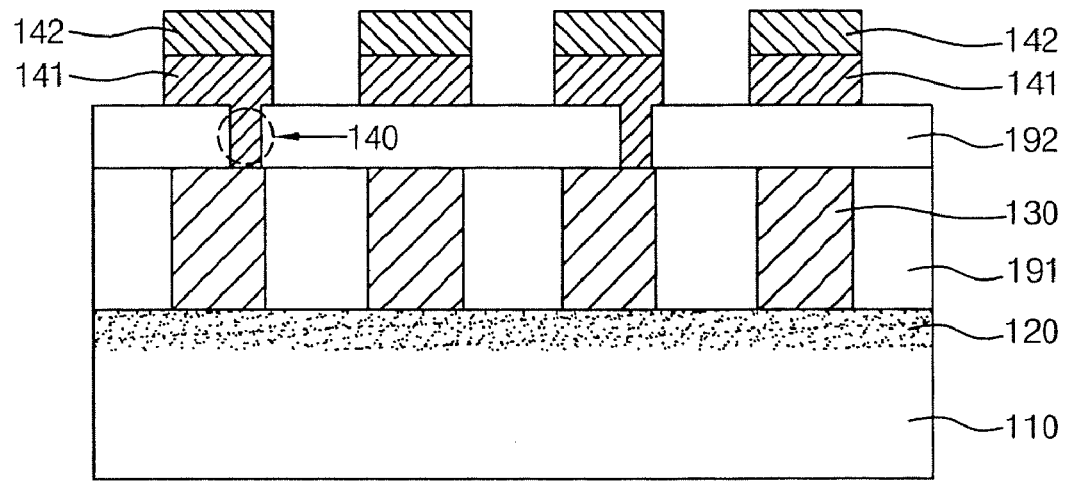

Referring to FIGS. 2C and 3C, a phase change material and an upper electrode material are sequentially deposited on the second interlayer dielectric 192 including the holes 192H. The phase change material is deposited on the surfaces of the holes 192H or to fill the holes 192H, and then the upper electrode material is deposited on the phase change material. Next, by etching both the upper electrode material and the phase change material, the stack patterns of line-shaped phase change patterns 141 and upper electrodes 142 are formed. The phase change patterns 141 are connected with the surfaces of the holes 192H and the vertical PN diodes 130 arranged in the second direction 202.

Preferably, the upper electrode material and the phase change material are sequentially etched, such that the phase change patterns 141 are formed to fill the holes 192H and contact the side surfaces of the vertical PN diodes 130, and the upper electrodes 142 are formed to have the same width as the phase change patterns 141. The phase change patterns 141 are formed such that portions of the phase change patterns 140 formed on the surfaces of the holes 192H and have a width of 10~100 nm.

Here, the phase change patterns 141 create interfaces which contact the vertical PN diodes 130, and phase change occurs in the portions of the phase change patterns 141 which are formed on the surfaces of the holes 192H. Accordingly, reset fail resulting from volume change when phase change occurs is reduced. Further, since the phase change patterns 141 are formed to include the surfaces of the holes 192H defined in the direction 301 diagonal to the first direction 201, when compared to the conventional art, the separation gap between adjoining phase change cells is increased, such that thermal influence from adjoining phase change cells can be reduced.

Figure 2D:
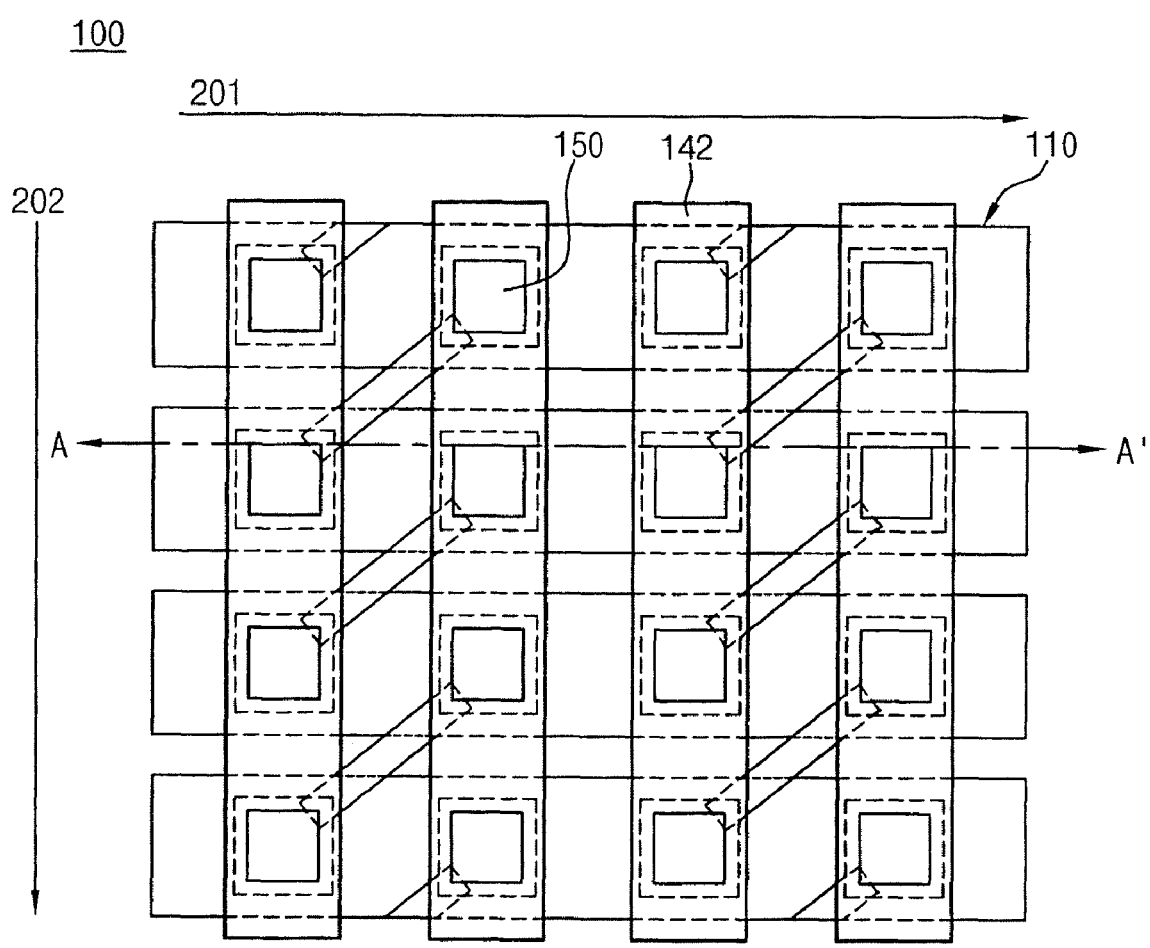
Figure 3D:
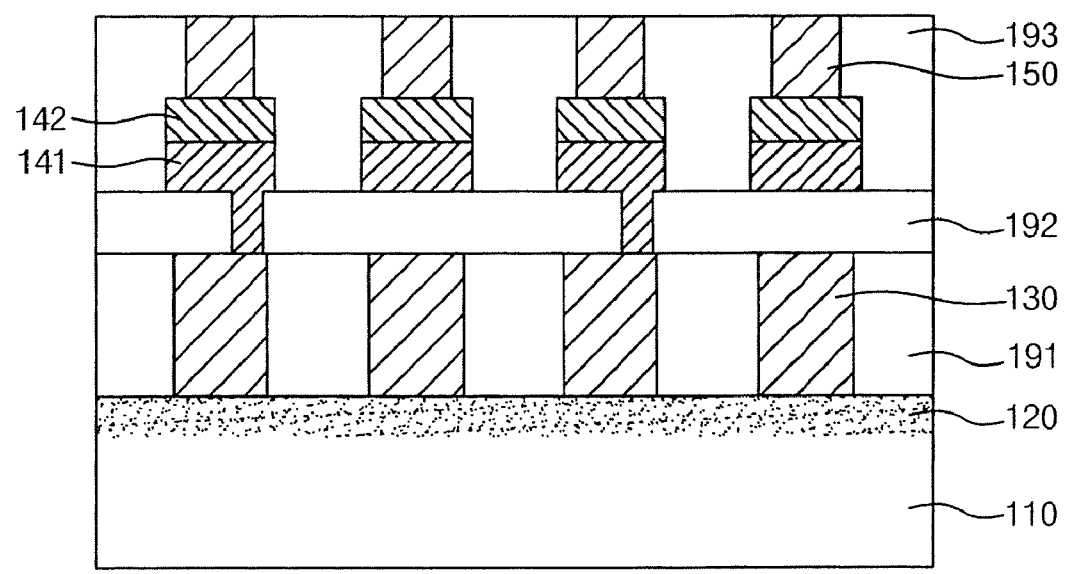

Referring to FIGS. 2D and 3D, a third interlayer dielectric 193 is formed to cover the stacked patterns of the phase change patterns 141 and the upper electrodes 142, then second contact holes are defined to expose the upper ends of the upper electrodes 142. Subsequently, upper electrode contacts 150 are formed in the second contact holes to be connected with the upper electrodes 142.

Figure 2E:
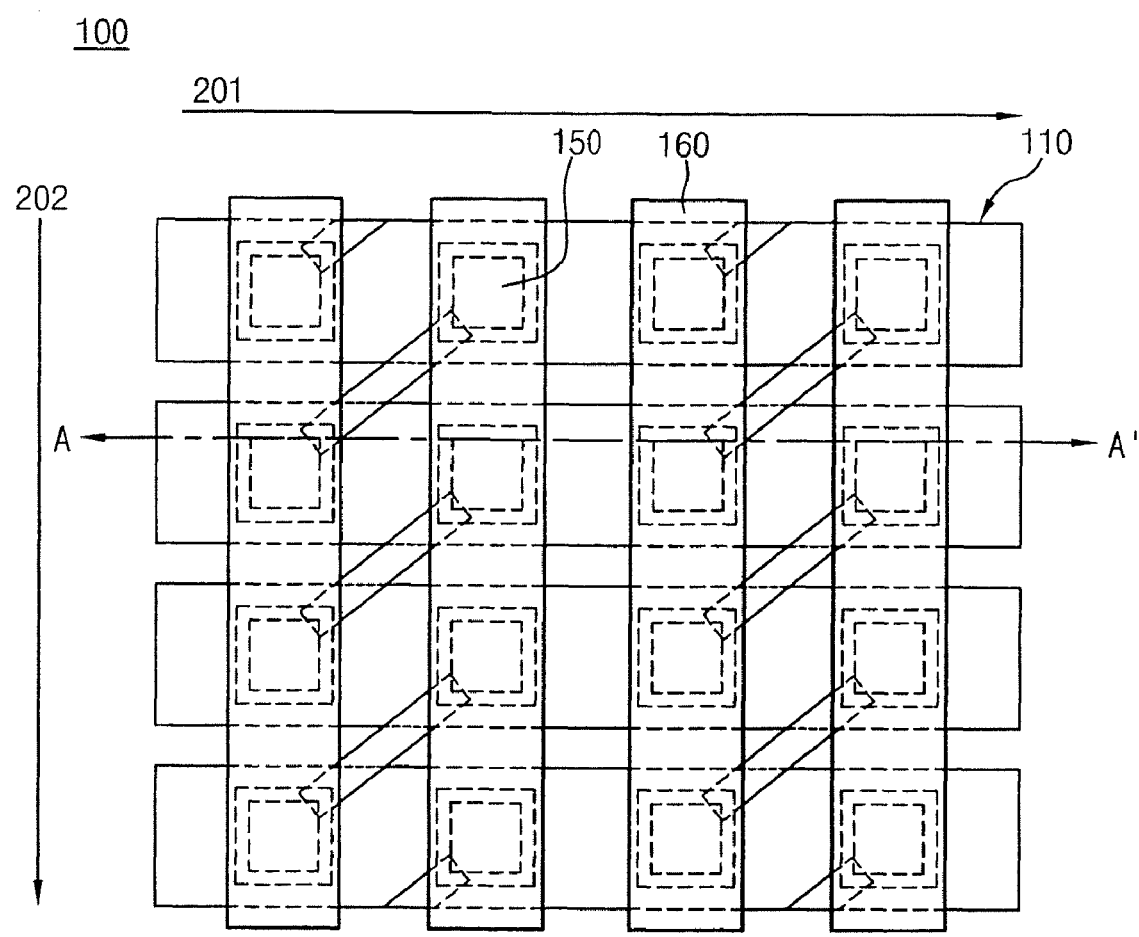
Figure 3E:
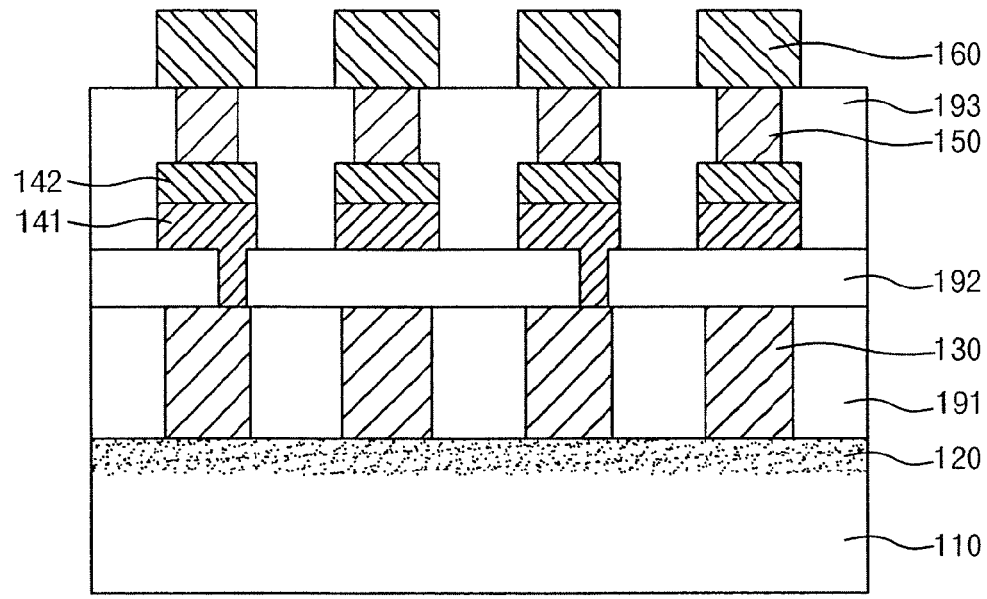

Referring to FIGS. 2E and 3E, bit lines 160 are formed on the third interlayer dielectric 193 and the upper electrode contacts 150 so as to be connected with the upper electrode contacts 150 formed in the second direction 202.

Figure 2F:
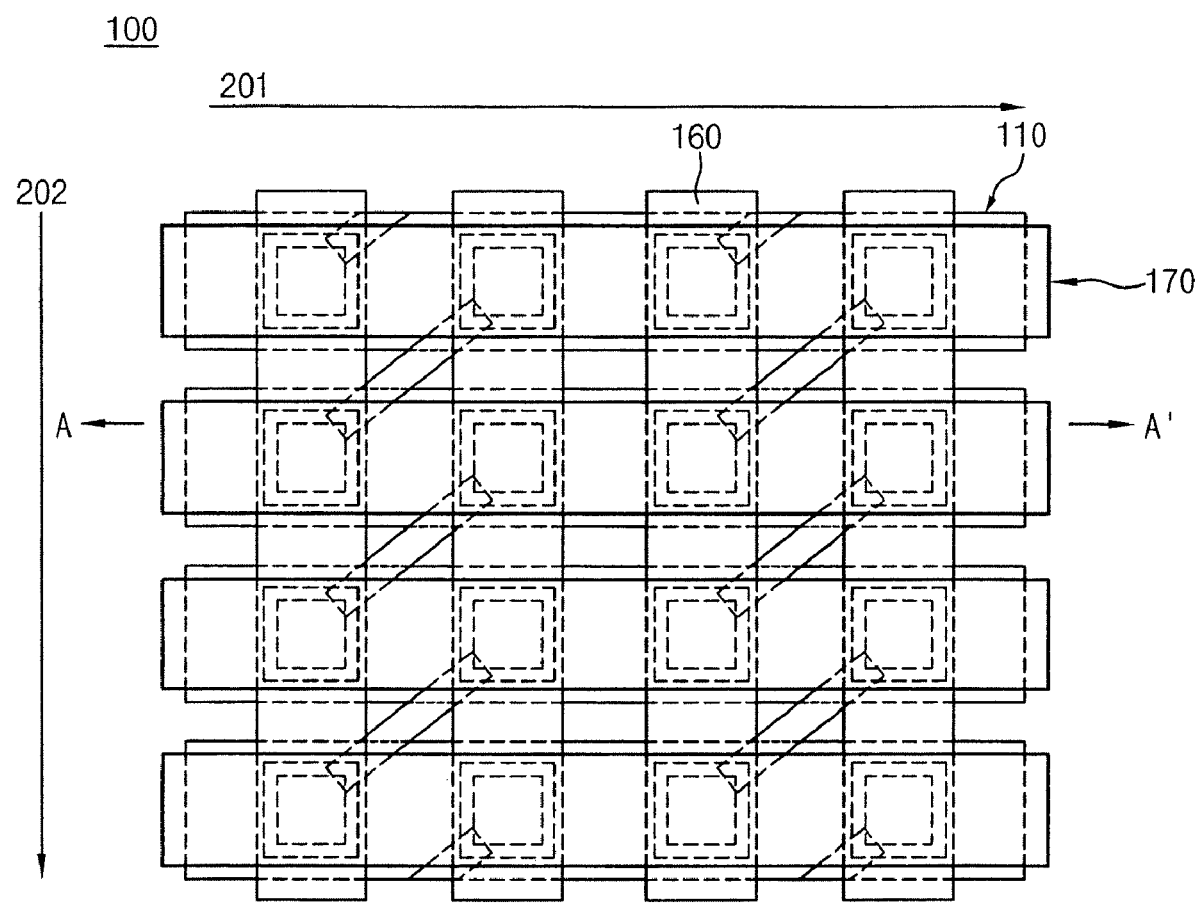
Figure 3F:
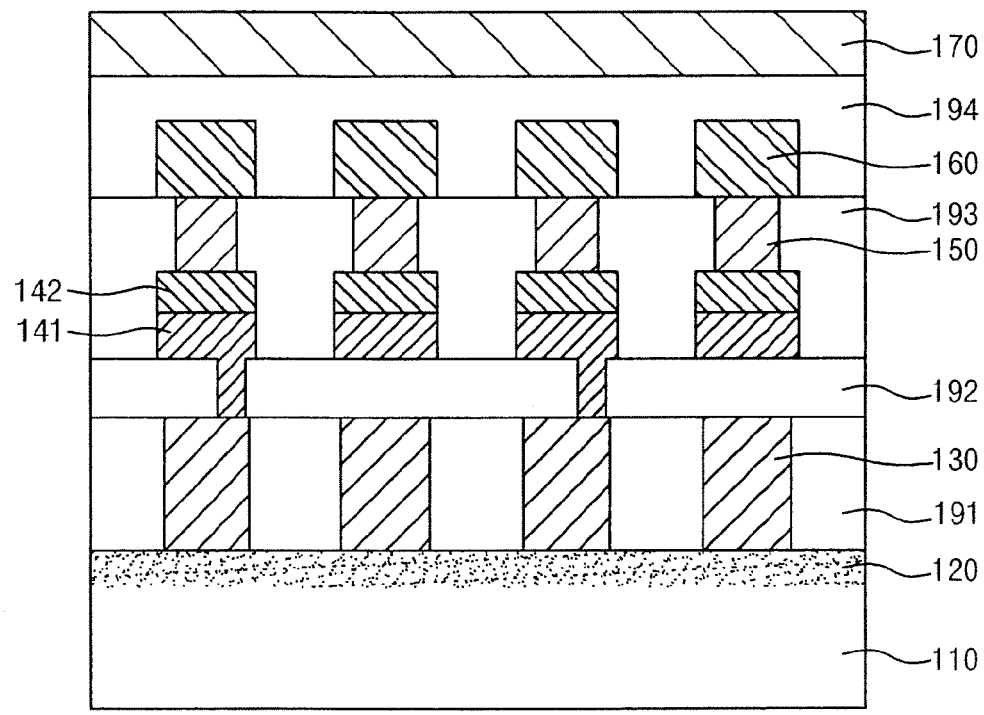

Referring to FIGS. 2F and 3F, a fourth interlayer dielectric 194 is formed on the third interlayer dielectric 193 and the bit lines 160, then, by etching the fourth interlayer dielectric 194, third contact holes (not shown) are defined to expose portions of the impurity regions 120 which will contact word lines to be subsequently formed. Contact plugs (not shown) are formed in the third contact holes to be connected with the exposed portions of the impurity regions 120, and then word lines 170 are formed so as to be connected with the contact plugs formed in the first direction 201.

Thereafter, while not shown in the drawings, by sequentially implementing a series of well-known subsequent processes, the manufacture of the phase change memory device in accordance with the present invention is completed.

In the aforementioned embodiment, it was described and shown that, in the pairs of vertical PN diodes 130 which are located adjacent to each other in the direction 301 diagonal to the first direction 201, the holes 192H are defined to expose portions of the vertical PN diodes 130, which diagonally face each other in the second direction 202, and portions of the first interlayer dielectric 191 between the portions of the vertical PN diodes 130.

Figure 4:
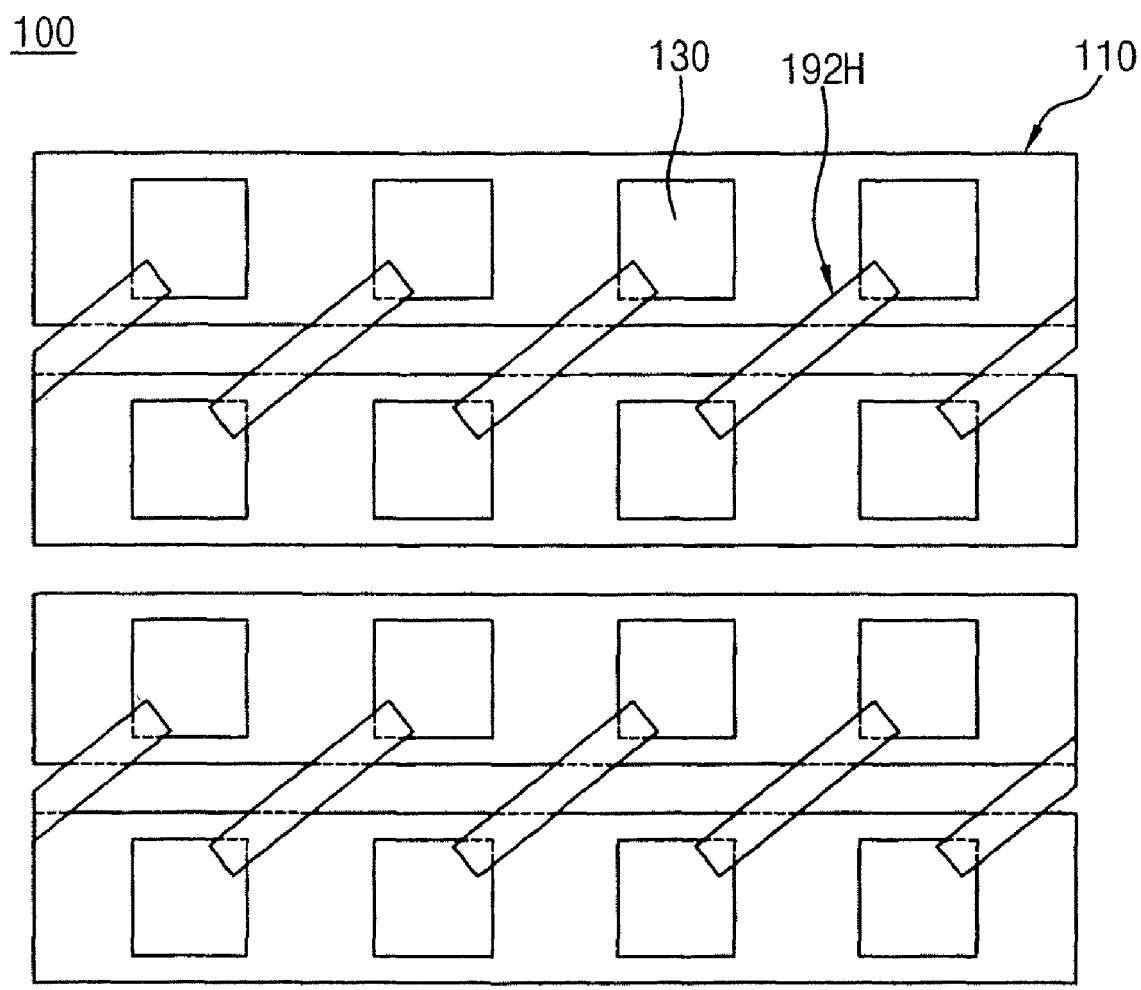
FIG. 4 is a plan view showing the holes defined in accordance with the present invention.

However, referring to FIG. 4, it is conceivable that, in pairs of vertical PN diodes 130 placed adjacent to each other in the direction 301 diagonal to the first direction 201 in each pair of active regions 110, the holes 192H can be arranged in the first direction 201 and can be defined to expose portions of the vertical PN diodes 130 which diagonally face each other in the first direction.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A phase change memory device including a silicon substrate comprising:
   a silicon substrate including a plurality of active regions which extend in a first direction and are arranged at regular intervals in a second direction perpendicular to the first direction;
   a plurality of switching elements formed in each active region of the silicon substrate to be spaced apart from one another; and
   a phase change pattern having the shape of a line formed to be in direct contact with side surfaces of a pair of switching elements, the pair of switching elements separated from each other in both the first direction and the second direction.

2. The phase change memory device according to claim 1, wherein the switching elements comprise vertical PN diodes.

3. The phase change memory device according to claim 1, wherein the phase change pattern is formed to contact side surfaces of the pair of switching elements separated from each other in both the first direction and the second direction, and the pair of switching elements are diagonally adjacent with respect to the first direction.

4. The phase change memory device according to claim 1, wherein the phase change pattern is formed to contact side surfaces of the pair of switching elements separated from each other in both the first direction and the second direction, and the pair of switching elements are diagonally adjacent with respect to the second direction.

5. The phase change memory device according to claim 1, further comprising:
   an upper electrode formed on the phase change pattern having the same shape as the phase change pattern.

* * * * *